(12) United States Patent
Morita et al.

(10) Patent No.: US 10,122,366 B2
(45) Date of Patent: Nov. 6, 2018

(54) CRYSTAL OSCILLATION DEVICE

(71) Applicant: Murata Manufacturing Co., Ltd., Nagaokakyo-shi, Kyoto-fu (JP)

(72) Inventors: Toru Morita, Nagaokakyo (JP); Toshiyuki Kakuya, Nagaokakyo (JP); Kenji Takayama, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 105 days.

(21) Appl. No.: 15/333,619

(22) Filed: Oct. 25, 2016

(65) Prior Publication Data

US 2017/0041007 A1    Feb. 9, 2017

Related U.S. Application Data

(63) Continuation of application No. PCT/JP2015/051346, filed on Jan. 20, 2015.

(30) Foreign Application Priority Data

May 7, 2014    (JP) .................. 2014-096022

(51) Int. Cl.
*H03B 5/32* (2006.01)
*H01L 41/053* (2006.01)
(Continued)

(52) U.S. Cl.
CPC .............. *H03L 1/028* (2013.01); *H01L 23/12* (2013.01); *H01L 23/34* (2013.01); *H01L 41/053* (2013.01);
(Continued)

(58) Field of Classification Search
CPC ....... H01L 23/12; H01L 23/34; H01L 41/053; H01L 41/083; H01L 41/0913;
(Continued)

(56) References Cited

U.S. PATENT DOCUMENTS 6,229,249 B1 *    5/2001    Hatanaka ................. H03B 5/04
310/348
9,013,244 B2 *    4/2015    Tokuhashi .............. H03L 1/022
331/158
(Continued)

FOREIGN PATENT DOCUMENTS

JP    2003318653 A    11/2003
JP    2004032456 A    1/2004
(Continued)

OTHER PUBLICATIONS

International Search Report issued for PCT/JP2015/051346, dated Mar. 10, 2015.
(Continued)

*Primary Examiner* — Levi Gannon
(74) *Attorney, Agent, or Firm* — Arent Fox LLP

(57) ABSTRACT

A crystal oscillation device in which crystal unit is mounted on a package board as a package material and the package board is joined to a mounting board by conductive joining materials. Moreover, a gap is provided between the package board and the mounting board other than portions joined by the conductive joining material and the conductive joining material.

18 Claims, 5 Drawing Sheets

(51) Int. Cl.
*H01L 41/083* (2006.01)
*H03H 9/05* (2006.01)
*H03L 1/02* (2006.01)
*H01L 23/12* (2006.01)
*H01L 23/34* (2006.01)
*H03H 9/10* (2006.01)
*H03H 9/17* (2006.01)

(52) U.S. Cl.
CPC ............ *H01L 41/083* (2013.01); *H03B 5/32* (2013.01); *H03H 9/0504* (2013.01); *H03H 9/0519* (2013.01); *H03H 9/0552* (2013.01); *H03H 9/10* (2013.01); *H03H 9/17* (2013.01); *H01L 2924/16152* (2013.01)

(58) Field of Classification Search
CPC .......... H01L 41/094; H03B 5/30; H03B 5/32; H03H 9/0519; H03H 9/0552; H03H 9/0557; H03H 9/0561; H03H 9/08; H03H 9/10; H03H 9/17; H03L 1/028
USPC .......................................... 331/66, 154, 158
See application file for complete search history.

(56) References Cited

U.S. PATENT DOCUMENTS

| | | | | |
|---|---|---|---|---|
| 9,041,476 B2* | 5/2015 | Asamura | ............ | H03H 9/0538 331/154 |
| 9,264,015 B2* | 2/2016 | Kikushima | .......... | H03H 9/0552 |
| 9,287,882 B2* | 3/2016 | Yokoo | ................. | H03H 9/0552 |
| 2005/0285482 A1* | 12/2005 | Oita | ......................... | H03B 5/32 310/343 |
| 2006/0170510 A1* | 8/2006 | Moriya | .................... | H03B 5/36 331/158 |
| 2006/0238264 A1* | 10/2006 | Hatanaka | ................. | H03L 1/04 331/158 |
| 2012/0209558 A1* | 8/2012 | Wilcox | ..................... | H03B 5/36 702/130 |
| 2015/0123515 A1* | 5/2015 | Miura | .................. | H03H 9/0552 310/315 |

FOREIGN PATENT DOCUMENTS

| | | |
|---|---|---|
| JP | 2004297211 A | 10/2004 |
| JP | 2005020633 A | 1/2005 |
| JP | 2005159575 A | 6/2005 |
| JP | 2008141413 A | 6/2008 |
| JP | 2009016949 A | 1/2009 |
| JP | 2010087726 A | 4/2010 |
| JP | 2012175499 A | 9/2012 |

OTHER PUBLICATIONS

Written Opinion of the International Searching Authority issued for PCT/JP2015/051346, dated Mar. 10, 2015.

* cited by examiner

CRYSTAL OSCILLATION DEVICE

CROSS REFERENCE TO RELATED APPLICATIONS

The present application is a continuation of PCT/JP2015/051346 filed Jan. 20, 2015, which claims priority to Japanese Patent Application No. 2014-096022, filed May 7, 2014, the entire contents of each of which are incorporated herein by reference.

TECHNICAL FIELD

The present disclosure relates to a crystal oscillation device in which a crystal unit is mounted on a package material and a temperature-sensitive element is mounted on a lower surface of the package material.

BACKGROUND

Crystal oscillation devices have been widely used for oscillators and the like. For example, Patent Document 1 described below discloses a crystal oscillation device in which a crystal resonator is mounted on a package board. In this example, an IC chip is fixed to a lower surface of the package board. A second board is laminated on the lower surface of the package board so as to surround the IC chip. The second board has a planar shape obtained by eliminating one side from a rectangular frame shape.

Meanwhile, in the crystal oscillation device disclosed in Patent Document 2 described below, a crystal resonator is mounted on a package board. A first leg portion and a second leg portion are provided on a lower surface of the package board at an interval. An electronic component element is fixed to the lower surface of the package board and between the first leg portion and the second leg portion.

In Patent Document 3 described below, an electronic component chip is fixed to a lower surface of a package in which a crystal resonator is housed. A metal bump joined to a lower surface of a package board is provided on an outer side portion of the electronic component chip.

Patent Document 4 described below discloses a structure in which a package in which a crystal unit is housed and a mounting board on which an IC chip is mounted are joined to each other via a bump.

Patent Document 1: Japanese Unexamined Patent Application Publication No. 2004-32456.
Patent Document 2: Japanese Unexamined Patent Application Publication No. 2005-20633.
Patent Document 3: Japanese Unexamined Patent Application Publication No. 2003-318653.
Patent Document 4: Japanese Unexamined Patent Application Publication No. 2010-87726.

In Patent Documents 1 to 3, the board or the leg portion provided to surround the electronic component element (such as an IC chip) is not present in a portion of a surrounding area of the electronic component such as an IC chip. Moreover, when heat is transmitted from the package board or the surrounding circuit element to the package board, the temperature of the electronic component element (such as an IC chip) easily increases. In a structure in which an IC chip including a temperature sensor is combined with a crystal resonator, when the temperature of the IC chip increases, frequency correction is performed by the included temperature sensor. Therefore, there is a problem that when the temperature of a surrounding area of the IC chip changes earlier than the temperature of a surrounding area of a crystal unit, a frequency shift will occur.

SUMMARY OF THE INVENTION

An object of the present disclosure is to provide a crystal oscillation device in which a change in the temperature of a temperature-sensitive element such as an IC including a temperature sensor is hard to occur.

A crystal oscillation device disclosed herein includes a first package material having a lower surface; a crystal unit mounted on the first package material; a temperature-sensitive element mounted on the lower surface of the first package material; and a mounting board joined to the lower surface of the first package material such that it at least partially surrounds the temperature-sensitive element. Moreover, the mounting board is joined to the lower surface of the first package material by a plurality of conductive joining materials, and a gap is provided between the lower surface of the first package material and the mounting board other than portions joined by the conductive joining materials.

In a specific aspect of the crystal oscillation device, a plurality of electrode lands are provided on an upper surface of the mounting board, and the plurality of conductive joining materials join the plurality of electrode lands to the first package material.

In another specific aspect of the crystal oscillation device, the mounting board has a cavity, and the temperature-sensitive element is located within the cavity.

In still another specific aspect of the crystal oscillation device, the mounting board includes a first mounting board member and a second mounting board member spaced apart from the first mounting board member, and the temperature-sensitive element is located between the first mounting board member and the second mounting board member.

In still another specific aspect of the crystal oscillation device, each of the first and second mounting board members has a strip shape.

In still another specific aspect of the crystal oscillation device, the first and second mounting board members include strip-shaped mounting board member main bodies and first and second extension portions each extending from the mounting board member main body toward a partner-side mounting board member side.

In still another specific aspect of the crystal oscillation device, the mounting board has a shape obtained by cutting a portion of a frame body in a plan view such that an outer side portion and an inner side portion surrounded by the frame body communicate with each other.

In another specific aspect of the crystal oscillation device, the frame body has a rectangular frame shape, and at least a portion of a side of the rectangular frame shape is cut.

In still another specific aspect of the crystal oscillation device, the crystal oscillation device further includes a second package material mounted on the first package material and forming, together with the first package material, a seal space in which the crystal unit is housed.

In another specific aspect of the crystal oscillation device, the first package material is a package board.

In the crystal oscillation device disclosed herein, even when heat is transmitted from the mounting board, since a heat passage is formed between the mounting board and an element board, it is possible to inhibit an increase in the temperature of the temperature-sensitive element.

DETAILED DESCRIPTION OF EMBODIMENTS

Hereinafter, specific embodiments of the present invention will be described with reference to the drawings to clarify the present invention.

Figure 1:
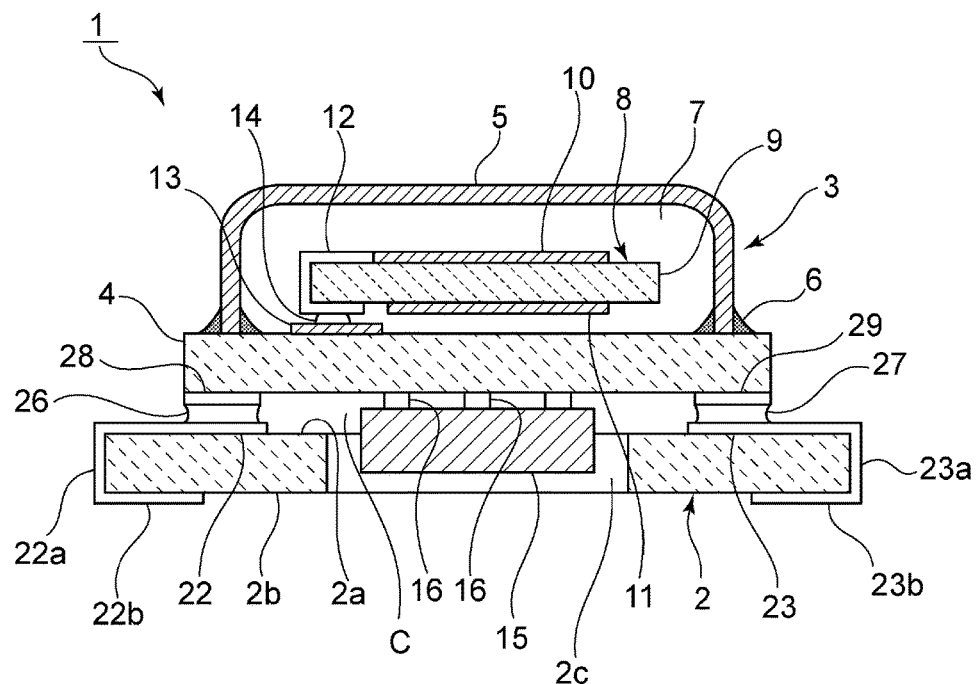
FIG. 1 is a front cross-sectional view of a crystal oscillation device according to a first embodiment of the present invention.

FIG. 1 is a front cross-sectional view of a crystal oscillation device according to a first embodiment of the present invention.

The crystal oscillation device 1 has a mounting board 2. The mounting board 2 has an upper surface 2a and a lower surface 2b. The lower surface 2b of the mounting board 2 is a surface at a side at which the crystal oscillation device 1 is mounted on a circuit board or the like.

Preferably, the mounting board 2 is formed from an appropriate ceramic material such as alumina, or a synthetic resin.

As shown, a crystal resonator 3 is mounted above the mounting board 2. The crystal resonator 3 includes a package board 4 as a first package material, and a cap 5 as a second package material. The cap 5 having an opening opened downward is joined to the package board 4 by a joining material 6. Accordingly, a sealed hollow space 7 is formed. A crystal unit 8 is disposed within the hollow space 7. The crystal unit 8 has a crystal substrate 9. A first excitation electrode 10 is provided on an upper surface of the crystal substrate 9. A second excitation electrode 11 is provided on a lower surface of the crystal substrate 9.

Figure 3:
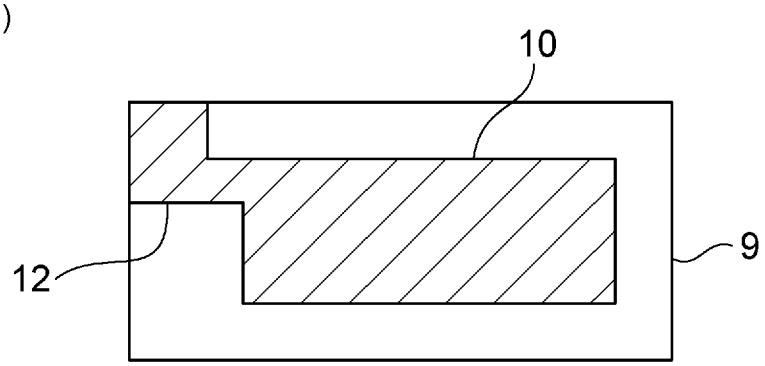
FIGS. 3(a) and 3(b) are a plan view showing an electrode shape on an upper surface of a crystal substrate used in the first embodiment of the present invention, and a schematic plan view showing a planar shape of an excitation electrode on a lower surface of the crystal substrate by seeing through the crystal substrate.
Figure 3B:
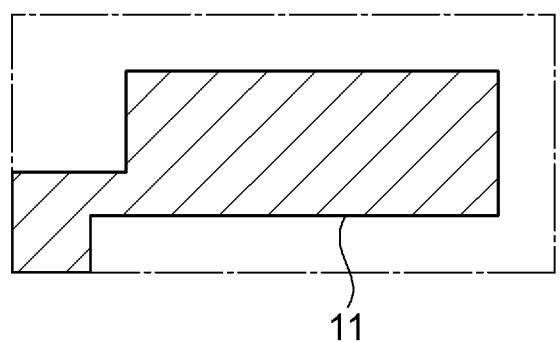

FIGS. 3(a) and 3(b) show planar shapes of the first and second excitation electrodes 10 and 11.

The first excitation electrode 10 and the second excitation electrode 11 are opposed to each other across the crystal substrate 9. As shown in FIG. 3(a), an extended electrode 12 is connected to the first excitation electrode 10. As shown in FIG. 1, the extended electrode 12 extends on a side surface of the crystal substrate 9 and reaches the lower surface thereof.

Furthermore, an electrode land 13 is provided on an upper surface of the package board 4. The extended electrode 12 is joined to the electrode land 13 via a conductive joining material 14. The second excitation electrode 11 is also joined to an electrode land, which is not shown, via a conductive joining material. Accordingly, the crystal unit 8 is supported in a cantilevered manner.

Preferably, each of the first and second excitation electrodes 10 and 11, the extended electrode 12, and the electrode land 13 is formed from an appropriate metal or alloy. Moreover, the conductive joining material 14 is formed from an appropriate conductive joining material, such as a conductive adhesive or a metallic brazing material.

In addition, the package board 4 is preferably formed from an insulating ceramic material such as alumina, or another appropriate insulating material. The cap 5 is formed from a metal, but may be formed from another material other than metal. The joining material 6 is formed from an appropriate adhesive or solder.

In the exemplary embodiment, an IC chip 15 including a temperature sensor is fixed to a lower surface of the package board 4. In one aspect, the IC chip 15 has a plurality of bumps 16 on an upper surface thereof. The bumps 16 are joined to electrodes (not shown) on the lower surface of the package board 4.

Figure 2:
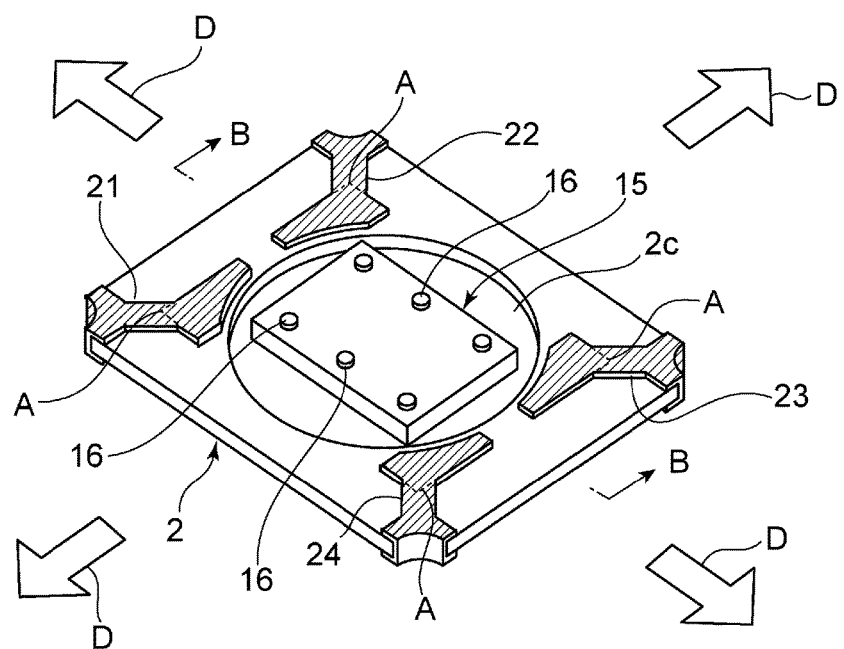
FIG. 2 is a schematic perspective view showing a relationship between a mounting board and an IC chip, as a temperature-sensitive element, used in the first embodiment of the present invention.

As shown in FIG. 2, the mounting board 2 has a cavity 2c at a center thereof. The IC chip 15 is located within the cavity 2c. Therefore, the thickness of the crystal oscillation device 1 can be reduced advantageously.

The IC chip 15 includes the temperature sensor. The IC chip 15 is provided for correcting frequency characteristics of the crystal unit 8 in response to a change in the temperature of a surrounding area thereof. Therefore, the difference between the temperature of the surrounding area of the IC chip 15 and the temperature of the crystal unit 8 sealed within the hollow space 7 and the difference between the degrees of change of these temperatures are desirably small.

Therefore, the ventilation property in the surrounding area of the IC chip 15 is enhanced by disposing the IC chip 15 within the cavity 2c.

However, in the present embodiment, a gap described below is further provided lateral to the IC chip 15 to ensure a heat passage. This will be more specifically described below with reference to FIGS. 1 and 2.

Figure 4:
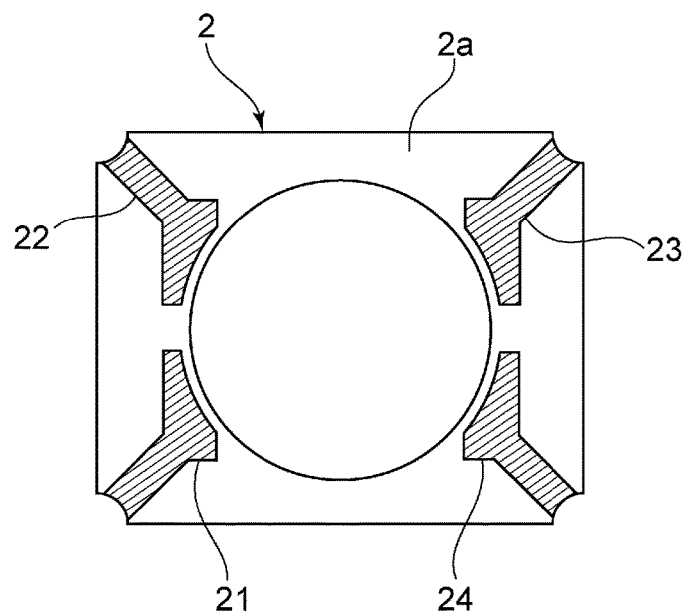
FIG. 4 is a schematic plan view of the mounting board used in the first embodiment of the present invention.

FIG. 2 is a schematic perspective view showing a positional relationship between the mounting board 2 and the IC chip 15 disposed in the cavity 2c. FIG. 4 is a plan view showing the mounting board 2.

According to the exemplary embodiment, a plurality of electrode lands 21 to 24 are provided on the mounting board 2. Broken lines A within the plurality of electrode lands 21 to 24 indicate a portion obtained by projecting downward the outer peripheral edge of the package board 4 to be mounted. Therefore, the crystal resonator 3 having the package board 4 is mounted above a region surrounded by the broken lines A. In FIG. 1, of the plurality of electrode lands 21 to 24, the electrode lands 22 and 23 are shown. That is, FIG. 1 is a front cross-sectional view of the entire crystal oscillation device 1 corresponding to a portion along the line B-B in FIG. 2.

As shown in FIG. 1, the electrode lands 22 and 23 are respectively connected to side surface portions 22a and 23a located on the side surface of the mounting board 2, and further connected to terminal portions 22b and 23b located on the lower surface 2b of the mounting board 2. The terminal portions 22b and 23b are used as terminals when the crystal oscillation device 1 is mounted on another circuit board or the like.

Although not particularly shown, the electrode lands 21 to 24 are also similarly connected to terminal portions provided on the lower surface of the mounting board 2.

Each of the electrode lands 21 to 24, and the side surface portions 22a and 23a, and the terminal portions 22b and 23b is formed from an appropriate metal or alloy.

In addition, as shown in FIG. 1, the electrode lands 22 and 23 are joined to junction electrodes 28 and 29 provided on the lower surface of the package board 4, by conductive joining materials 26 and 27. Although not particularly shown, similarly to the electrode lands 22 and 23, the electrode lands 21 and 24 are also joined to junction electrodes provided on the lower surface of the package board 4, by conductive joining materials.

The junction electrodes 28 and 29 are electrically connected to the above-described first and second excitation electrodes 10 and 11 by portions that are not shown. Each of the junction electrodes 28 and 29 is formed from an appropriate metal or alloy.

The junction electrodes 28 and 29 are electrically connected through internal electrodes and the like in the package board 4 that are not shown and electrodes (not shown) on the lower surface of the package board 4 via the bumps 16 to the IC chip 15.

Similarly, the above-described first and second excitation electrodes 10 and 11 are also electrically connected via the conductive joining material 14 and the electrode land 13 through internal electrodes (not shown) and the like in the package board 4 finally to the IC chip 15.

Similarly to the conductive joining material 14, each of the conductive joining materials 26 and 27 is formed from a conductive adhesive, a metallic brazing material, or the like.

Advantageously, in the surrounding area of the IC chip 15, a gap C is provided between the conductive joining materials 26 and 27 that form joint portions of the mounting board 2 and the package board 4. That is, the conductive joining material is applied to portions, at the inner side of the broken lines A, of the electrode lands 21 to 24 shown in FIG. 2. As shown in FIG. 1, a gap is formed between the electrode lands 22 and 23. Similarly, gaps are present between the electrode lands 21 and 22, between the electrode lands 23 and 24, and between the electrode lands 24 and 21. Therefore, in the crystal oscillation device 1, at a height position at which the mounting board 2 is joined to the package board 4, the gap C is formed lateral to the IC chip 15. Thus, as shown in FIG. 2, a sufficient heat passage D is ensured at each side.

On the other hand, in the case where the crystal oscillation device 1 is mounted on a circuit board or the like, heat from the circuit board side or a surrounding circuit element may be transmitted from the terminal portions 22b and 23b. In this case, although the heat is transmitted to the electrode lands 22 and 23, since the heat passage D is provided, the heat will not be trapped in the surrounding area of the IC chip 15. Therefore, an increase in the temperature of the IC chip 15 is inhibited. Accordingly, it is possible to reduce the difference in temperature between the IC chip 15 and the crystal unit 8 sealed in the hollow space 7 or the difference in temperature change therebetween. Thus, it is possible to accurately correct the frequency characteristics of the crystal unit 8 on the basis of the temperature detected by the temperature sensor included in the IC chip 15.

Figure 5:
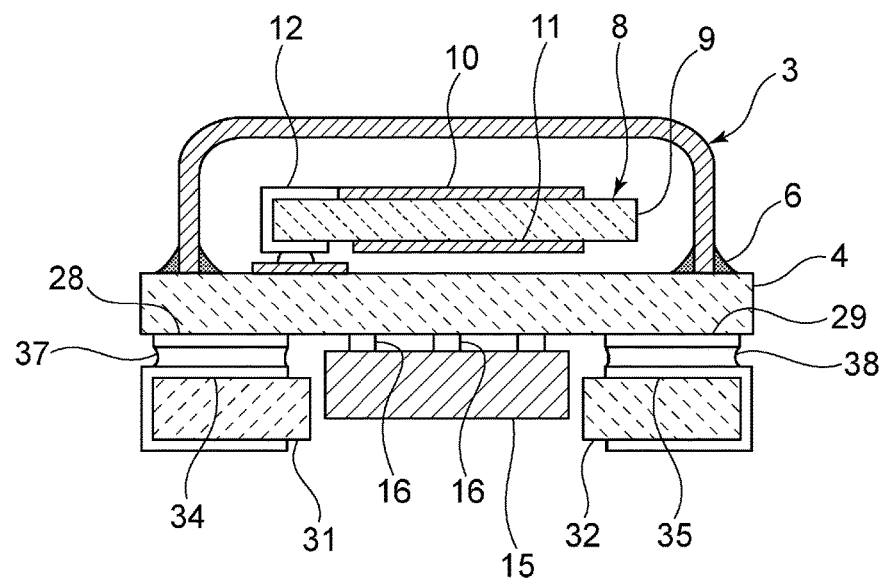
FIG. 5 is a front cross-sectional view of a crystal oscillation device according to a second embodiment of the present invention.

FIG. 5 is a front cross-sectional view of a crystal oscillation device according to a second embodiment of the present invention. The second embodiment is different from the first embodiment in that first and second mounting board members 31 and 32 are used as a mounting board instead of the mounting board 2. Therefore, the other portions are designated by the same reference signs, and the above description of the first embodiment is used for the other portions.

In the second embodiment, the first and second mounting board members 31 and 32 are joined to the lower surface of the package board 4. The positional relationship between the first and second mounting board members 31 and 32 and the IC chip 15 is shown in a perspective view in FIG. 6.

Figure 6:
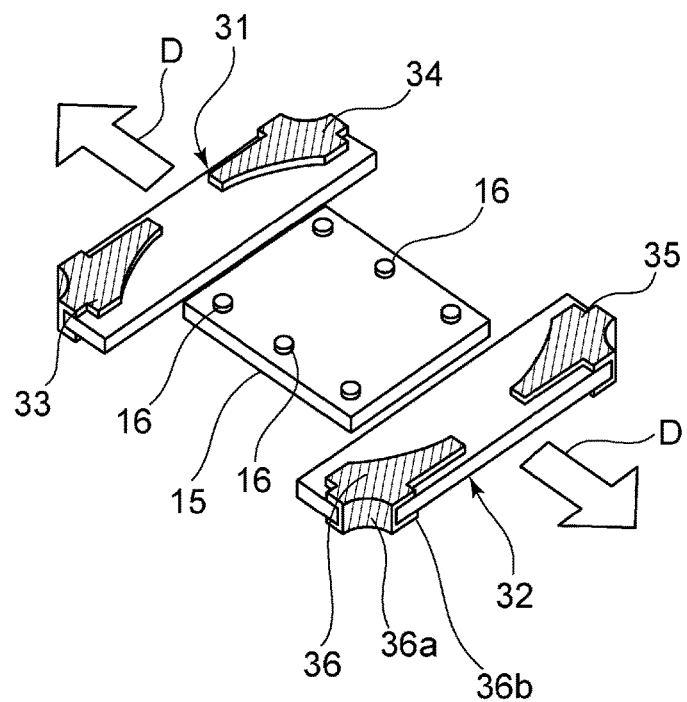
FIG. 6 is a perspective view showing a positional relationship between first and second mounting board members and an IC chip and a relationship between the first and second mounting board members and a heat passage in the crystal oscillation device according to the second embodiment of the present invention.

As shown in FIGS. 5 and 6, the first mounting board member 31 has a strip shape. In other words, the first mounting board member 31 has an elongated rectangular planar shape. Each of the first and second mounting board members 31 and 32 may be formed from an appropriate insulating material such as alumina.

As shown in FIG. 6, electrode lands 33 and 34 are provided on an upper surface of the first mounting board member 31 so as to be spaced apart from each other in a lengthwise direction of the first mounting board member 31. Electrode lands 35 and 36 are also provided on the upper surface of the second mounting board member 32 so as to be spaced apart from each other in a lengthwise direction thereof. The electrode land 36 has a side surface portion 36a and a terminal portion 36b. The side surface portion 36a and the terminal portion 36b are provided similarly to the side surface portion 22a and the terminal portion 22b in the first embodiment. Similarly, each of the other electrode lands 33, 34, and 35 has a terminal portion at a side surface portion.

In the present embodiment shown in FIG. 5, the electrode lands 34 and 35 are joined to the junction electrodes 28 and 29 by conductive joining materials 37 and 38. The electrode lands 33 and 36 are also joined to junction electrodes provided on the lower surface of the package board 4, by conductive joining materials. These conductive joining materials are applied to upper surfaces of the electrode lands 33 to 36 shown in FIG. 6.

Therefore, a gap is provided between the adjacent conductive joining materials 37 and 38. That is, in addition to the gap between the first mounting board member 31 and the second mounting board member 32 occurs, gaps between the conductive joining materials occur between the electrode land 33 and the electrode land 34 and between the electrode land 35 and the electrode land 36 in FIG. 6 at a height position at which the first and second mounting board members 31 and 32 are joined to the package board 4. Therefore, a heat passage indicated by arrows D, D in FIG. 6 is formed.

Thus, in the second embodiment as well, similarly as in the first embodiment, even when heat is transmitted when the crystal oscillation device is mounted on a circuit board or the like, the heat will not be trapped in the surrounding area of the IC chip 15. Accordingly, it is possible to inhibit an increase in the temperature of the IC chip 15. Thus, it is possible to reduce the difference in temperatures between the IC chip 15 and the crystal unit 8 and the difference in temperature change therebetween.

Figure 7:
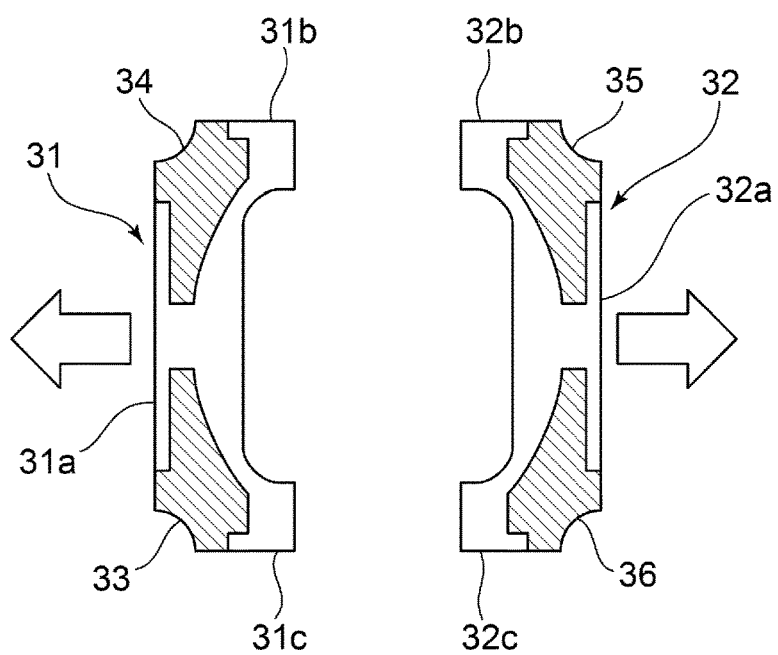
FIG. 7 is a plan view showing first and second mounting board members used in a third embodiment of the present invention.

FIG. 7 is a plan view for explaining mounting board members used in a third embodiment of the present invention. In the second embodiment, the first and second mounting board members 31 and 32 each having a strip shape are used. Meanwhile, as shown in FIG. 7, first and second mounting board members may have mounting board member main bodies 31a and 32a each having a strip shape and first and second extension portions 31b, 31c, 32b, and 32c extending from both ends of the mounting board member main bodies 31a and 32a toward the partner-side mounting board member side.

In this case as well, between the electrode lands 33 and 34 and between the electrode lands 35 and 36, gaps for forming a heat passage between the adjacent conductive joining materials are formed. Therefore, the advantageous effects as those in the second embodiment are obtained.

Figure 8:
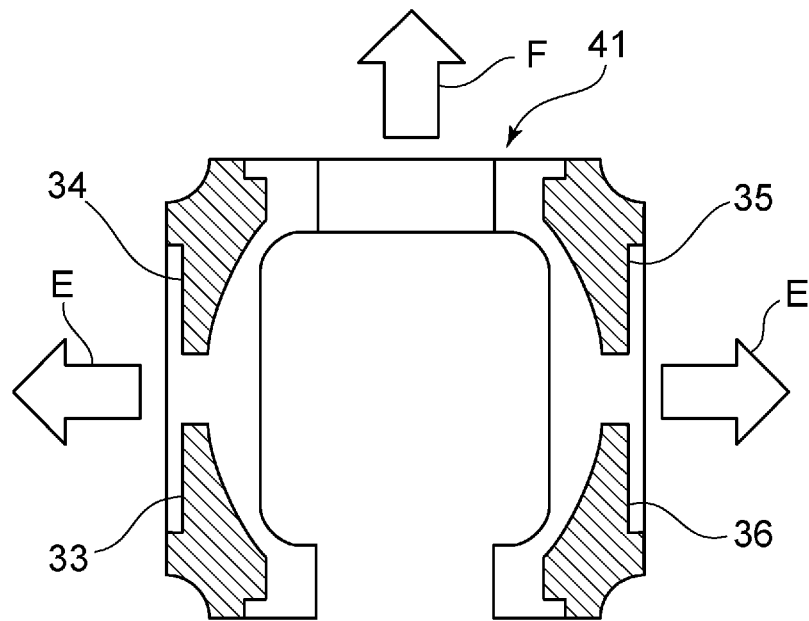
FIGS. 8(a) and 8(b) are a plan view and a perspective view showing a mounting board member used in a fourth embodiment of the present invention.
Figure 8:
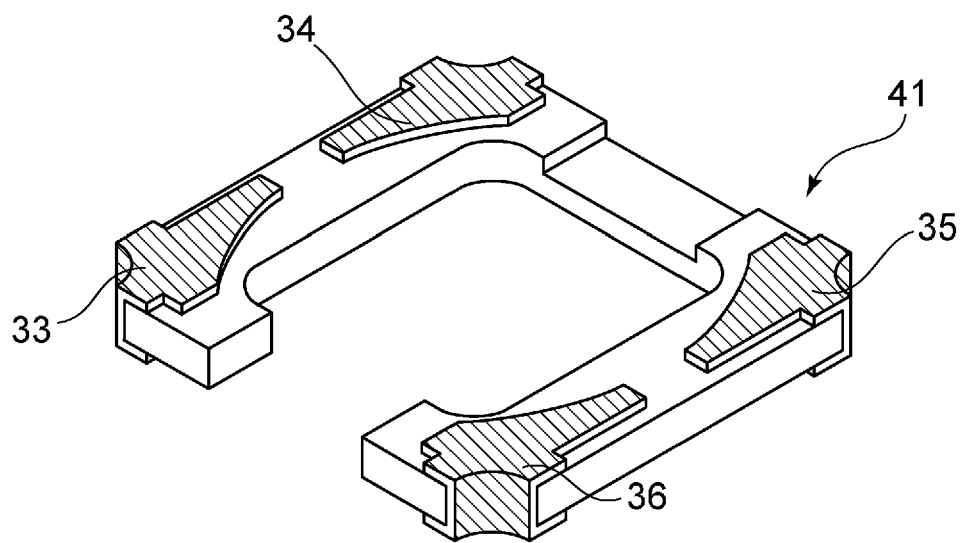

Furthermore, FIGS. 8(a) and 8(b) are a plan view and a perspective view showing a mounting board member used in a fourth embodiment. The shaped mounting board member 41 shown in FIGS. 8(a) and 8(b) is obtained by cutting a portion of a frame body in a plan view such that an outer side portion and an inner side portion surrounded by the frame shape communicate with each other. In other words, the mounting board member 41 is formed in a shape obtained by cutting at least a portion of one side of a rectangular frame shape. However, the frame planar shape is not limited to the rectangular shape, and may be a circular frame body or a polygonal frame body other than a quadrangular frame body.

Also in the case where the mounting board member 41 is used, since the electrode lands 33 to 36 are formed similarly as in the second embodiment, a heat passage through which heat is movable in a direction shown by arrows E, E is formed. Furthermore, in the present embodiment, also in a direction shown by an arrow F, a gap is formed between the adjacent conductive joining materials, so that a heat passage is formed. Therefore, heat is further hard to be trapped in the surrounding area of the IC chip.

In the first and second embodiments, the first package material is a package board, and the second package material is a cap. However, the first and second package materials are not limited thereto. For example, a structure may be provided in which a crystal unit is mounted on an inner bottom surface of a first package material having an opening opened upward, and the upper opening of the first package material is sealed by a lid as a second package material.

In addition, in the above first and second embodiments, the IC chip including the temperature sensor is shown as a temperature-sensitive element, but the temperature-sensitive element may be another temperature-sensitive element such as a thermistor.

REFERENCE SIGNS LIST 1 crystal oscillation device
2 mounting board
2a upper surface
2b lower surface
2c cavity
3 crystal resonator
4 package board
5 cap
6 joining material
7 hollow space
8 crystal unit
9 crystal substrate
10 first excitation electrode
11 second excitation electrode
12 extended electrode
13 electrode land
14 conductive joining material
15 IC chip
16 bump
21 to 24 electrode land
22a, 23a side surface portion
22b, 23b terminal portion
26, 27 conductive joining material
28, 29 junction electrode
31 first mounting board member
32 second mounting board member
31a mounting board member main body
32a mounting board member main body
31b, 31c, 32b, 32c first and second extension portions
33 to 36 electrode land
36a side surface portion
36b terminal portion
37, 38 conductive joining material
41 mounting board member

The invention claimed is:

1. A crystal oscillation device comprising:
a first package material having opposing upper and lower surfaces;
a crystal unit coupled to the upper surface of the first package material;
a mounting board coupled to the lower surface of the first package material and defining a cavity in a portion of the mounting board; and
a temperature-sensitive element coupled to the lower surface of the first package material and disposed at least partially in the cavity of the mounting board,
wherein the mounting board is coupled to the lower surface of the first package material by a plurality of conductive joining materials, such that a gap is provided between the lower surface of the first package material and the mounting board other than where the plurality of conductive joining materials couple the mounting board to the first package material, and
wherein the mounting board includes first and second mounting board members spaced apart from each other to define the cavity, such that the temperature-sensitive element is disposed between the first and second mounting board members.

2. The crystal oscillation device according to claim 1, wherein a plurality of electrode lands are disposed on an upper surface of the mounting board, and the plurality of conductive joining materials respectively join the plurality of electrode lands to the first package material.

3. The crystal oscillation device according to claim 1, wherein the cavity of the mounting board surrounds the temperature-sensitive element.

4. The crystal oscillation device according to claim 1, wherein each of the first and second mounting board members comprises a strip shape.

5. The crystal oscillation device according to claim 1, wherein the first and second mounting board members comprise strip-shaped main bodies and first and second extension portions that each extend outward from the main body.

6. The crystal oscillation device according to claim 1, further comprising a second package material mounted on the first package material to form a sealed space with the crystal unit housed therein.

7. The crystal oscillation device according to claim 1, wherein the first package material is a package board.

8. The crystal oscillation device according to claim 1, wherein the crystal unit is coupled to the upper surface of the first package material by an electrode land.

9. The crystal oscillation device according to claim 8, wherein the crystal unit is attached to the first packaging material in a cantilevered manner.

10. The crystal oscillation device according to claim 1, wherein the crystal unit comprises a crystal substrate with a pair of electrodes disposed on opposite sides of the crystal substrate.

11. The crystal oscillation device according to claim 1, wherein the temperature-sensitive element is coupled to the lower surface of the first package material by a plurality of conductive bumps spaced apart from each other.

12. A crystal oscillation device comprising:
   a first package material having opposing upper and lower surfaces;
   a crystal unit coupled to the upper surface of the first package material;
   a mounting board coupled to the lower surface of the first package material and defining a cavity in a portion of the mounting board; and
   a temperature-sensitive element coupled to the lower surface of the first package material and disposed at least partially in the cavity of the mounting board,
   wherein the mounting board is coupled to the lower surface of the first package material by a plurality of conductive joining materials, such that a gap is provided between the lower surface of the first package material and the mounting board other than where the plurality of conductive joining materials couple the mounting board to the first package material, and
   wherein the mounting board comprises a shape of a frame body with a cutout portion in a plan view, such that an outer side portion and an inner side portion surrounded by the frame body communicate with each other.

13. The crystal oscillation device according to claim 12, wherein the frame body has a rectangular frame shape, and at least a portion of a side of the rectangular frame shape is cut out.

14. A crystal oscillation device comprising:
   a package material having opposing upper and lower surfaces;
   a crystal unit coupled to the upper surface of the package material;
   a temperature-sensitive element coupled to the lower surface of the package material; and
   a mounting board coupled to the lower surface of the package material by a plurality of conductive joining materials, such that the mounting board at least partially surrounds the temperature-sensitive element,
   wherein a gap is provided between the lower surface of the package material and the mounting board other than where the plurality of conductive joining materials couple the mounting board to the package material, and
   wherein the mounting board includes first and second mounting board members spaced apart from each other, such that the temperature-sensitive element is disposed between the first and second mounting board members.

15. The crystal oscillation device according to claim 14, further comprising a plurality of electrode lands disposed on an upper surface of the mounting board, wherein the plurality of conductive joining materials respectively join the plurality of electrode lands to the package material.

16. The crystal oscillation device according to claim 14, wherein the mounting board has a cavity with the temperature-sensitive element positioned within the cavity.

17. The crystal oscillation device according to claim 14, wherein each of the first and second mounting board members comprises a strip shape.

18. The crystal oscillation device according to claim 14, wherein the first and second mounting board members comprise strip-shaped main bodies and first and second extension portions that each extend outward from the main body.

* * * * *